United States Patent
Pancholy et al.

(10) Patent No.: US 6,775,191 B1
(45) Date of Patent: Aug. 10, 2004

(54) MEMORY CIRCUIT WITH SELECTIVE ADDRESS PATH

(75) Inventors: Ashish Pancholy, Milpitas, CA (US); Jong Hak Yuh, Pleasanton, CA (US); Gary A. Gibbs, San Jose, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/277,340

(22) Filed: Oct. 22, 2002

(51) Int. Cl.[7] .................................................. G11C 7/00
(52) U.S. Cl. .............. 365/194; 365/189.04; 365/189.01
(58) Field of Search ............................ 365/194, 189.04, 365/230.01, 189.01, 230.08, 233, 189.08, 230.05

(56) References Cited

U.S. PATENT DOCUMENTS

| | | | | |
|---|---|---|---|---|
| 5,636,354 A | * | 6/1997 | Lear ........................... | 395/403 |
| 5,935,428 A | * | 8/1999 | Yamamoto et al. .......... | 210/128 |
| 6,199,185 B1 | * | 3/2001 | Ju et al. ...................... | 714/744 |
| 6,320,794 B1 | * | 11/2001 | Kang et al. ............ | 365/189.02 |
| 6,463,066 B2 | * | 10/2002 | Moriwaki et al. .......... | 370/412 |

* cited by examiner

*Primary Examiner*—Thong Q. Le
(74) *Attorney, Agent, or Firm*—Kevin L. Daffer; Mollie B. Lettang; Conley Rose P.C.

(57) ABSTRACT

A memory circuit which is adapted to identify memory cells within a first time interval for a write operation of the circuit and identify the memory cells within a second time interval for a read operation of the circuit is provided. In some cases, the memory circuit may include an address path which includes a different circuit path for the read operations than for the write operations of the circuit. In addition, the memory circuit may include a means for intentionally delaying the identification of the memory cells for the write operation of the circuit. In some cases, the memory circuit may further include a means for intentionally delaying the identification of memory cells for the read operation of the circuit. Alternatively, the memory circuit may be absent a means for intentionally delaying the identification of memory cells for the read operation of the circuit.

20 Claims, 4 Drawing Sheets

MEMORY CIRCUIT WITH SELECTIVE ADDRESS PATH

BACKGROUND OF THE INVENTION

1. Field of the Invention

This invention relates to random access memory circuits and, more particularly, to address path configurations within memory circuits.

2. Description of the Related Art

The following descriptions and examples are given as background information only.

Random access memory (RAM) is generally used to refer to memory to which data can be written and from which data can be read. More specifically RAM may refer to memory with which data can be written to and read from randomly rather than in a set sequence. In many cases, the locations at which data is written and stored may be accessed by address paths of the RAM circuit. In particular, the addresses at which data may be written to or read from may be specified by inputs to the address paths. In this manner, an operation of a RAM memory circuit may include addressing particular memory locations and either writing to or reading from the locations. In order to insure that valid data is written to or read from a correct memory location, the write and/or read cycles of a RAM memory circuit may include specifications which stipulate the duration of address, write, and/or read operations of the circuit.

For example, "access time," as used herein, may refer to the period from which an address is asserted for a read operation to a time at which data at such an address is considered valid at the chip outputs. "Valid," as used herein, may refer to a state in which a specified parameter, such as data, is considered to be correct. In addition, the "assertion" of an address may refer to the input of the address along the address path of the circuit. Consequently, a valid bit may not be read from a memory location until after the memory location is identified and the data at such a memory location is considered valid. A duration specified for the write operation of a memory circuit may, on the other hand, include "address hold time." "Address hold time," as used herein, may refer to the time for which an address of one or more memory cells is held after a write operation is terminated. Such a time range may be used to insure that data from a write operation is not inadvertently written to a memory location subsequently addressed by the operation of the circuit.

In general, it is desirable to minimize the access time and/or the address hold time, such that the overall operating speed of the memory circuit may be increased. One manner with which to minimize address hold time is to incorporate an intentional delay within the address paths of the memory circuit. Such a configuration may allow the address of a memory location to be de-asserted a relatively short time after, or in some embodiments, immediately subsequent to the end of a write operation. More specifically, the incorporation of an intentional delay within address paths of a memory circuit may increase the time for which an address of a memory location is identified, thereby preventing a previous write operation from inadvertently writing to a subsequent address location. Consequently, the time used to hold an address subsequent to a write operation of a circuit may be reduced or eliminated. However, the incorporation of an intentional delay within the address paths of a circuit increases the time for which addresses of memory locations are identified for the read operations as well as for the write operations of the circuit. As a result, the amount of time needed to access valid data during a read operation of the circuit is increased relative to circuits which do not include an intentional delay within the address paths of the circuit. In other words, the incorporation of an intentional delay within the address paths of a circuit may increase the access time of the read operations of the circuit. Consequently, the configuration of including an intentional delay within the address paths of a circuit may reduce the operating speed of the read operations of the memory circuit.

Therefore, it may be advantageous to develop a memory circuit which reduces address hold time without increasing the access time of the read operations of the device. In particular, it may be beneficial to fabricate a memory circuit which reduces address hold time for the write operations of the memory circuit while maintaining the time at which a valid bit may be read from the memory cell.

SUMMARY OF THE INVENTION

The problems outlined above may be in large part addressed by a memory circuit that is adapted to identify one or more memory cells within a first time interval for a write operation of the circuit and identify the one or more memory cells within a second time interval for a read operation of the circuit. Preferably, the first time interval is different than the second time interval. More specifically, the first time interval is preferably greater than the second time interval. In yet other embodiments, however, the first time interval may be less than the second time interval. In any case, the memory circuit described herein may include an address path which includes a different circuit path for the read operations than for the write operations of the circuit. More specifically, the memory circuit described herein may include an address path having a first circuit path for the write operation and a second circuit path for the read operation, wherein the first and second circuit paths are different. "Address path," as used herein, may refer to a portion of the memory circuit which is adapted to identify memory cells for read and write operations of the circuit. As such, the address path of the memory circuit described herein may be one of a plurality of address paths within the memory circuit having similar components and circuit path configurations.

In general, the first circuit path of the address path described herein includes a means for intentionally delaying the identification of the memory cells for the write operation of the circuit. In some cases, the means for intentionally delaying the identification of the memory cells for the write operation may include a delay circuit, such as a resistor, capacitor, logic inverter, and/or any means used in circuit fabrication to intentionally delay the transmission of a signal along a logic path or circuit path. In some cases, the second circuit path may be absent of such a means for intentionally delaying the identification of memory cells for the read operation of the circuit. Alternatively, the second circuit path may include a means for intentionally delaying the identification of memory cells for the read operation of the circuit.

In any case, the means for intentionally delaying the identification of memory cells for the write operation of the memory circuit described herein may be arranged along a variety of locations of the address path. For example, in some cases, the address path may include at least two decoded address lines coupled to a main address line by a logic decoder. In some embodiments, the means for intentionally delaying the identification of memory cells for the write operation of the memory circuit may be arranged along the main address line. In other embodiments, the means for intentionally delaying the identification of memory cells for the write operation of the memory circuit may be alternatively arranged along one of the decoded address lines. In yet other cases, the means for intentionally delaying the identification of memory cells for the write operation of the memory circuit may be arranged within the logic decoder. In any case, the memory circuit described herein may further include additional means for intentionally delaying the identification of memory cells for the write operation of the memory circuit in some embodiments. Such an additional means may be arranged along another of the decoded address lines of the address path, the main address line, and/or within the logic decoder.

In some cases, the circuit path adapted for identifying the memory cells during the write operations of the circuit may be included in a shunt extending from the circuit path adapted for identifying the memory cells during the read operations of the circuit. Consequently, the memory circuit described herein may include a means for intentionally delaying the identification of memory cells for the write operation of the circuit on a shunt of an address path, in some embodiments. In yet other embodiments, the circuit path adapted for identifying the memory cells during the read operations of the circuit may be included in a shunt extending from the circuit path adapted for identifying the memory cells during the write operations of the circuit. In such an embodiment, the memory circuit described herein may include a means for intentionally delaying the identification of memory cells for the write operation of the circuit on a portion of an address path bypassed by a shunt. More specifically, the address path of the memory circuit described herein may include a delay circuit and a shunt adapted to bypass the delay circuit. In some cases, the shunt may also include a delay circuit with which to intentionally delay the identification of memory cells for the read operation of the circuit. In yet other embodiments, the shunt may be absent of such a delay circuit. In either case, a memory circuit is provided which includes an address path with a shunt adapted to bypass a portion of the address path.

There may be several advantages to fabricating the memory circuit described herein. In particular, the address hold time for the write operations of the memory circuit may be reduced such that an address may be de-asserted within a relatively short time or immediately subsequent to the termination of a write operation of the circuit. In addition, while the address hold time may be reduced, the time for which a valid bit may be read from a memory cell may stay the same. More specifically, the address hold time may be reduced without increasing the access time of the read operations of the device. As a result, the operating speed of the read operation of the circuit may be increased relative to conventional circuits.

BRIEF DESCRIPTION OF THE DRAWINGS

Other objects and advantages of the invention will become apparent upon reading the following detailed description and upon reference to the accompanying drawings in which.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
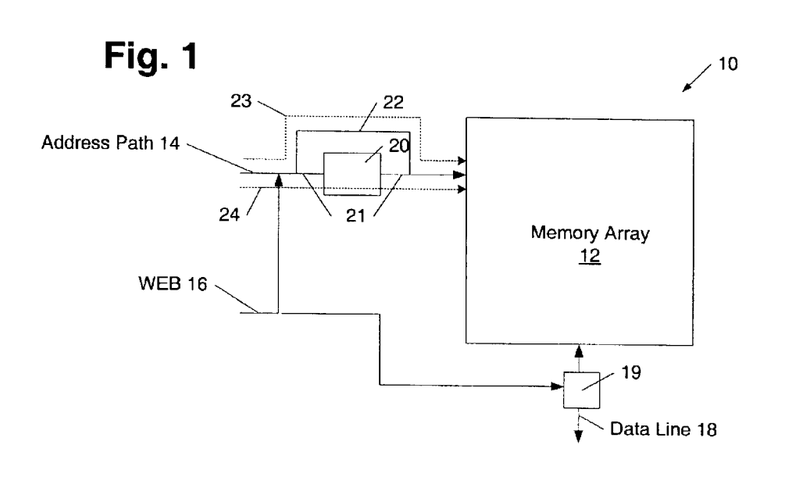
FIG. 1 depicts a partial block diagram of a random access memory circuit.

Turning to the drawings, an exemplary embodiment of the memory circuit described herein is provided in FIG. 1. In particular, FIG. 1 illustrates asynchronous random access memory (RAM) circuit 10 including address path 14 and data path 18 coupled to memory array 12. In addition, RAM circuit 10 includes write enable bar (WEB) 16 coupled to address path 14 and input/output control 19, which is coupled to data path 18. Furthermore, RAM circuit 10 may include delay 20 incorporated into a portion of address path 14 as described in more detail below. In general, an asynchronous RAM circuit may refer to a RAM circuit which is adapted to change its state in response to input changes on any of the control lines of the circuit, rather than at the transition of clock signals as is adapted for synchronous RAM circuits. For example, the state of asynchronous RAM circuit 10 may be adapted to change upon input asserted along address path 14, WEB 16, and/or data path 18. It is noted that RAM circuit 10 may include additional components than those shown in FIG. 1. For example, RAM circuit 10 may include a plurality of control lines in addition to WEB 16 with which to control the operations of the circuit. In addition, RAM circuit 10 may include a control logic block adapted to direct the signals along the control lines of the circuit to other input/outlines lines of the circuit. Such additional components are not shown in FIG. 1 to simplify the illustration of RAM circuit 10. Therefore, the configuration of RAM circuit 10 is not restricted to the specific illustration of FIG. 1.

In general, WEB 16 may be adapted to specify whether RAM circuit 10 is adapted for a write or a read operation. In particular, WEB 16 may be adapted to control whether data is received from or applied to data path 18. More specifically, WEB 16 may be coupled to input/output control 19 which is adapted to control whether data is received from or applied to data path 18, depending on whether WEB 16 is in a read or write mode, respectively. Consequently, data path 18 may be adapted to send or receive data from the memory locations of memory array 12. In other words, data path 18 may serve as a common input/output data line. In yet other embodiments, RAM circuit 10 may include separate input and output data lines. In either case, WEB 16 may be further or alternatively adapted to control which circuit path a signal along address path 14 follows. More specifically, WEB 16 may be adapted to control whether a signal along address path 14 follows a circuit path comprising portion 21 or a circuit path comprising portion 22, depending on whether WEB 16 is in a write or read mode, respectively. Such a configuration of address path 14 having at least two distinct circuit paths is described in more detail below.

In any case, address path 14 may be adapted to identify memory cells within memory array 12 for write and read operations of RAM circuit 10. More specifically, address path 14 may be adapted to locate memory cells within memory array 12 which a user of the circuit has selected for a write or read operation of the circuit. In this manner, the "selection" of memory cells, as used herein, may refer to the action taken by a user of the circuit for addressing memory cells. On the other hand, the "identification" of memory cells may refer to the propagation of signals within a circuit which results in locating memory cells corresponding to selected addresses. It is noted that although only one address path is illustrated in FIG. 1, RAM circuit 10 may include a plurality of address paths with which to identify memory locations within memory array 12. In particular, RAM circuit 10 may include a plurality of address paths with similar configurations and components as described below for address path 14.

As stated above, address path 14 may be adapted to have at least two distinct circuit paths. In particular, address path 14 may include circuit path 23 following portion 22 and circuit path 24 following portion 21. In general, portion 21 may include the portion of address path 14 which is bypassed by portion 22. Alternatively stated, portion 22 may bypass portion 21 and, therefore, may be referred to as a shunt. In alternative viewpoint, portion 22 may be referred to as a portion of address path 14 which bypasses portion 21 and, therefore, may be referred to as a shunt in some embodiments. It is noted that circuit paths 23 and 24 are depicted as dotted lines shifted relative to the solid lines of address path 14 in FIG. 1 to illustrate the relative routes of the circuit paths. In an actual circuit, the circuit paths are propagated along the address path. Consequently, the dotted lines are not to be inferred as additional lines or paths included within RAM circuit 10. In addition, "circuit path" and "logic path", as used herein, may refer to the route along which a signal is directed. As such, the terms, "circuit path" and "logic path," may be used interchangeably herein.

Figure 9:
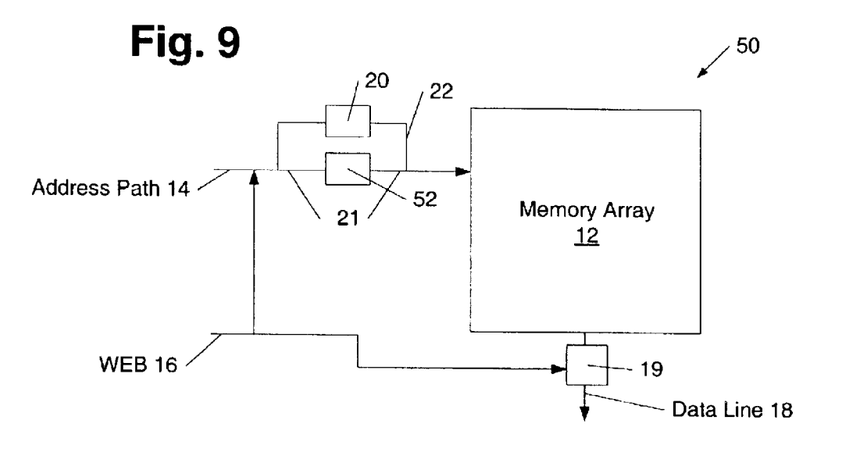
FIG. 9 depicts a partial block diagram of a random access memory circuit in yet another alternative embodiment.

As shown in FIG. 1, address path 14 may include delay 20 arranged along portion 21. In an alternative embodiment, address path 14 may include delay 20 along portion 22 while portion 21 may not include a delay. An example of such an embodiment is described in more detail below in reference to FIG. 9. In yet another embodiment, address path 14 may include a delay on each of portions 21 and 22. FIG. 9, as described in more detail below, illustrates an example of such an embodiment. In any case, delay 20 may include a means for intentionally delaying the propagation of a signal along address path 14. In general, every device and line configuration comprises a certain amount of delay. However, "a means for intentionally delaying the propagation of a signal", as used herein, may include a device or line configuration adapted to postpone the propagation of a signal along a circuit path beyond what may be adequately obtained within a circuit having particular critical dimensions and operating parameters. More specifically, "an intentional delay" may refer to a device or line configuration specifically added within a circuit to serve a primary purpose of delaying the propagation of a signal along a logic path of the circuit For example, an intentional delay may include a delay circuit such as a resistor, capacitor, logic inverter, and/or any other means known in the circuit fabrication industry for delaying the propagation of a signal along a circuit path. In yet other embodiments, an intentional delay may include increasing the length of the line or decreasing the thickness of the line.

In contrast, an "unintentional delay" may refer to a device or line configuration that inadvertently delays the propagation of a signal along a circuit path while serving another function for the circuit and/or meeting the size specifications for the circuit. More specifically, an unintentional delay may refer to a device or line configuration that inadvertently delays the propagation of a signal along a circuit path, but also changes the operation of the circuit with regard to its intended function in the absence of the device or line configuration. In particular, the exclusion of an "unintentional delay," as defined herein, may render a circuit to operate in a less desirable manner than in a case in which the unintentional delay is included in the circuit. For example, the exclusion of an "unintentional delay," as defined herein, may render a circuit to operate less efficiently or with higher power requirements than in a case in which the unintentional delay is included. In yet other embodiments, the exclusion of an "unintentional delay" may render a circuit inoperable.

An exemplary distinction between "intentional" and "unintentional" delays may be described in reference to resistance capacitance (RC) delays of circuit lines. As is well known, resistivity generally differs between materials. As such, if a line having a certain capacitance may be efficiently and adequately made of a material having a particular amount of resistivity, the inclusion of a material having a higher resistivity within such a line may be referred to as an incorporation of an intentional delay within the circuit. More specifically, since the increase in resistivity within the line would cause a higher RC delay and thus, more of a delay within the circuit, the line configuration incorporating such a material may be referred to as an "unintentional" delay, as defined herein. Similarly, a line fabricated with a thickness lower than what is necessary to operate a circuit at a given power may be referred to as an "unintentional" delay, since the reduction of line thickness generally increases RC delays within the line.

In contrast, a line configuration incorporating the material with lower resistivity at a thickness within the design specification of the circuit may be referred to as an unintentional delay. More specifically, a line which is efficiently and adequately fabricated with design specifications and a material that allows the line to have the lowest possible RC delay for its intended function may be referred to as an unintentional delay within a circuit. In general, the efficiency and adequacy of a material to be fabricated may depend on the ease or difficulty associated with the fabrication process and/or the design of the circuit. Therefore, the efficiency and adequacy of a material to be fabricated may differ from one application to another.

In a preferred embodiment, one of circuit paths 23 and 24 may be designated for the write operations of the circuit while the other of the circuit paths may be designated for the read operations of the circuit. In this manner, address path 14 may include a different circuit path for the read operations of RAM circuit 10 than for the write operations of RAM circuit 10. More specifically, RAM circuit 10 may be adapted to selectively propagate a signal along either a circuit path designated for a write operation of the circuit or a circuit path designated for a read operation of the circuit. In particular, RAM circuit 10 may be adapted to selectively propagate a signal along either circuit path 23 or circuit path 24 in response to the state of WEB 16. Such a configuration is distinctly different from conventional memory circuits, which include the same logic paths or "dual-operation logic paths" for both the read and write operations of the circuit. In some embodiments, the circuit path designated for the write operations of the circuit may be along a shunt extending from the circuit path designated for the read operations of the circuit. In yet other embodiments, the circuit path designated for the read operations of the circuit may be along a shunt extending from the circuit path designated for the write operations of the circuit.

Figure 8:
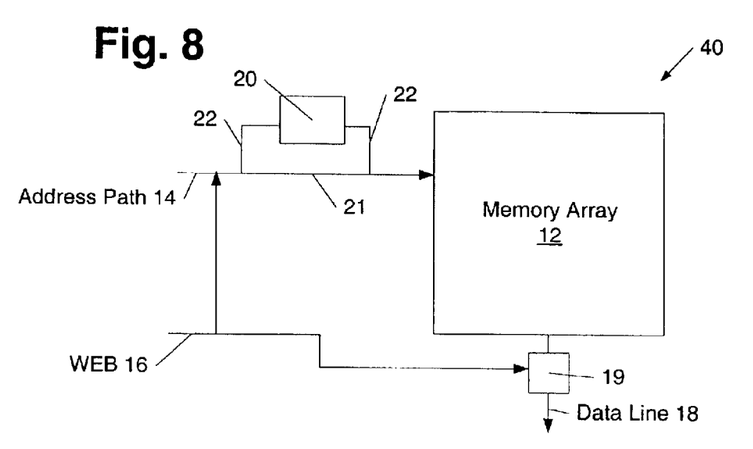
FIG. 8 depicts a partial block diagram of a random access memory circuit in an alternative embodiment.

In either case, the circuit path designated for the write operations of RAM circuit 10 may preferably include delay 20. In this manner, delay 20 may include a means for intentionally delaying the identification of memory cells for the write operations of RAM circuit 10. Consequently, as shown in FIG. 1, circuit path 24 may be adapted for the write operations of RAM circuit 10 and circuit path 23 may be adapted for the read operations of RAM circuit 10. In some embodiments, the circuit path designated for the read operations of a RAM circuit may also include an intentional delay. An exemplary figure illustrating such a embodiment is shown in FIG. 8 and described in more detail below. In such an embodiment, the circuit is preferably adapted such that the delay along the circuit path corresponding to the read operation is less than the delay included along the circuit path corresponding the write operation of the circuit. In yet other embodiments, the circuit path designated for the read operations of a RAM circuit may not include an intentional delay, such as depicted for circuit path 23 in FIG. 1.

With the inclusion of distinct circuit paths for read and write operations and a delay on one or both of the paths, RAM circuit 10 may be adapted to identify one or more memory cells within a first time interval for a write operation of the circuit and identify the one or more memory cells within a second time interval for a read operation of the circuit. Preferably, the first time interval is different than the second time interval. More specifically, the first time interval is preferably greater than the second time interval. In yet other embodiments, however, the first time interval may be less than the second time interval. In an embodiment in which the time interval for addressing the memory cells for the write operations of the circuit is greater than the time interval for addressing the memory cells for the read operations of the circuit, the circuit may advantageously reduce address hold time without increasing the time at which data may be read from the circuit. More specifically, the address hold time may be reduced without increasing the access time of the read operations of the device. Consequently, the operating speed of the read operation may be increased relative to conventional circuits.

Figure 4A:
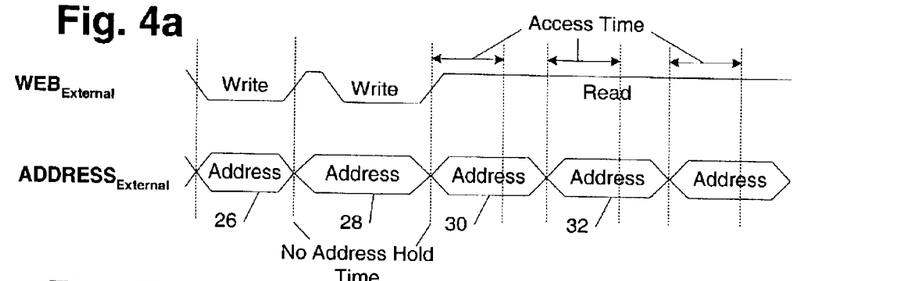
FIG. 4a depicts an exemplary timing chart for inputs placed on pins coupled to the random access memory circuit depicted in FIG. 1.
Figure 4B:
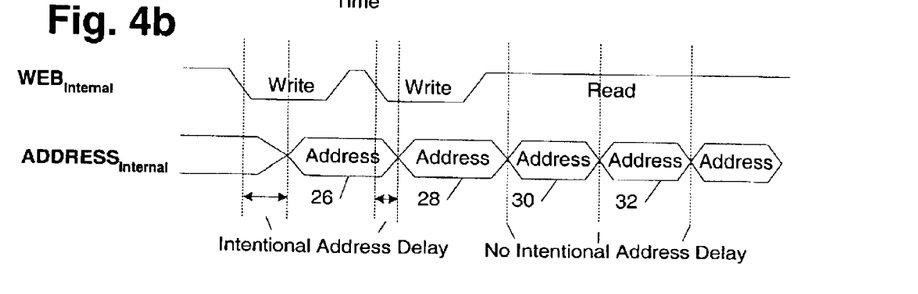
FIG. 4b depicts an exemplary timing chart for the input changes depicted in FIG. 4a relative to the internal circuitry of the random access memory circuit depicted in FIG. 1.

Exemplary timing diagrams of a memory circuit described herein are depicted in FIGS. 4a and 4b. In particular, FIG. 4a illustrates an exemplary timing diagram of input changes placed on pins coupled to the WEB and the address paths of the circuit described herein. Such pins are generally arranged external to the circuit such that they are accessible by a user of the circuit. FIG. 4b, on the other hand, illustrates an exemplary timing diagram of internal versions of the signals depicted in FIG. 4a within the circuit itself. More specifically, FIG. 4b illustrates the timing of the address signals relative to the signals along the WEB internal to the RAM circuit. Such timing diagrams may be used to illustrate the reduction of address hold times for the circuit described herein as well as the prevention of increasing time for which data may be read from the circuit.

Figure 2A:
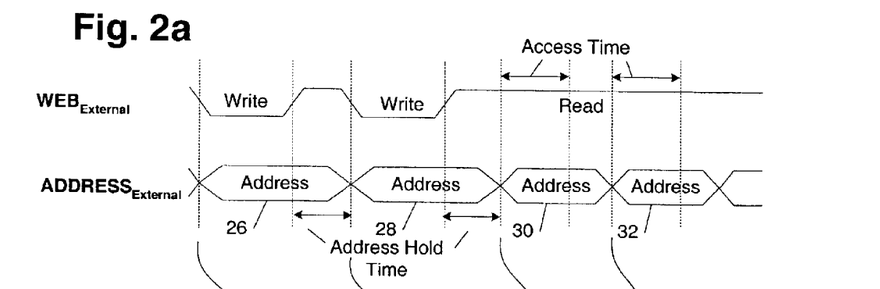
FIG. 2a depicts an exemplary timing chart for inputs placed on pins coupled to a random access memory circuit which is substantially absent of intentional delays on address paths of the circuit.
Figure 2B:
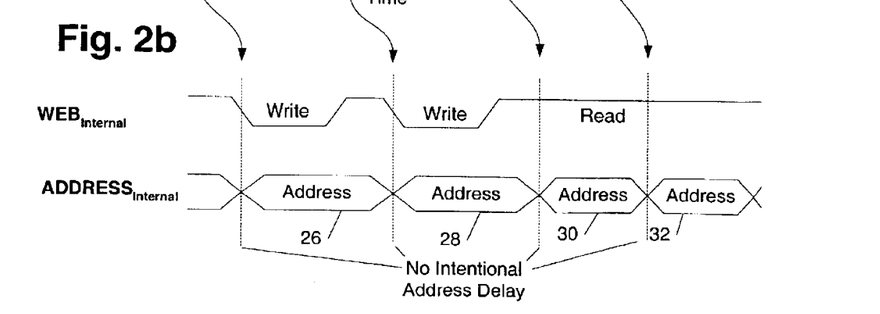
FIG. 2b depicts an exemplary timing chart for the input changes depicted in FIG. 2a relative to the internal circuitry of the circuit.
Figure 3A:
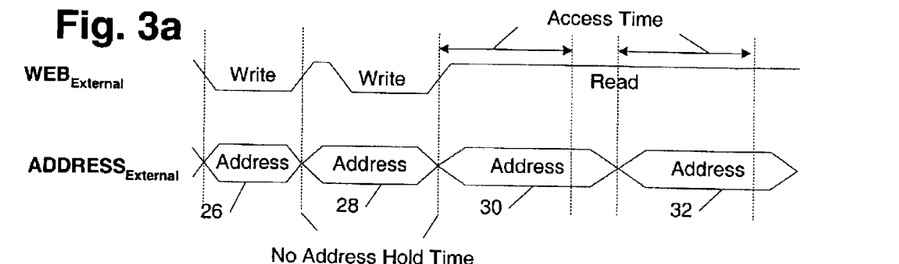
FIG. 3a depicts an exemplary timing chart for inputs placed on pins coupled to a random access memory circuit which includes intentional delays arranged along dual-operation logic paths of the circuit.
Figure 3B:
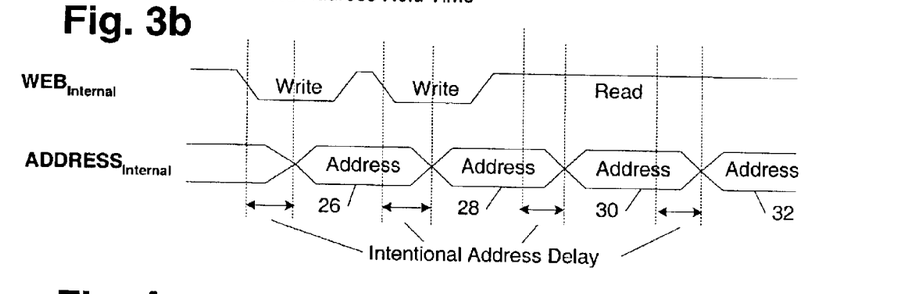
FIG. 3b depicts an exemplary timing chart for the input changes depicted in FIG. 3a relative to the internal circuitry of the circuit.

In particular, FIGS. 4a and 4b may be used to illustrate the circuit described herein as having reduced address hold times and/or reduced access times relative to conventional circuits. As such, FIGS. 4a and 4b may be compared to FIGS. 2a–3b to illustrate the benefits of the circuit described herein. In general, FIGS. 2a–3b depict exemplary timing diagrams of conventional circuits. In particular, FIGS. 2a and 2b depict exemplary timing diagrams of a conventional circuit that is absent of intentional delays along the logic paths of the circuit. In contrast, FIGS. 3a and 3b depict exemplary timing diagrams of a conventional circuit that includes an intentional delay along the logic paths for both the write and read operations of the circuit. In general, the perspective of FIGS. 2a and 3a may be similar to FIG. 4a in that they reflect the input changes placed on pins external to the circuit. Likewise, FIGS. 2b and 3b may be similar to the perspective of FIG. 4b in that they illustrate the respective input changes of FIGS. 2a and 3a within the circuit itself.

As shown FIGS. 2a–4b, the signal along a write enable bar (WEB) may oscillate between high and low states. The embodiments in FIGS. 2a–4b illustrate a low state of the WEB to indicate a write mode and a high state to indicate a read mode. As such, the timing of a write cycle, as used herein, may refer to the region between the falling and rising edges of the WEB in the timing diagram. Accordingly, the timing of a read cycle, as used herein, may refer to the region between the rising and falling edges of the WEB in the timing diagram. Such definitions of the write and read cycles of a circuit and the categorizations of the high and low states of the WEB may be reversed, however, in other embodiments. In any case and as used herein, the beginning and the termination of the write and read cycles may be designated at the mid-points of the falling and rising edges of the WEB, in some embodiments. However, in other cases, the beginning and the termination of the write and read cycles may be designated at the start or end of the falling and rising edges of the WEB.

FIGS. 2a–4b further illustrate the timing of holding addresses during the operational cycles of a circuit relative to the WEB. More specifically, FIGS. 2a–4b illustrate addresses 26 and 28 held during a write cycle of the circuit and addresses 30 and 32 held during a read cycle of the circuit. In some embodiments, the address corresponding to a write operation of the circuit may be entered or selected simultaneously with the input to the WEB. For example, the transition of address 26 may be aligned with the mid-portion of the falling edge of the WEB, as shown in FIG. 2a. In yet other embodiments, the addresses for the operation of the circuit may be entered slightly subsequent to the input to the WEB. In any case, it generally takes a finite amount of time to implement the changes placed on the external pins of the circuit within the circuit itself. As such, the input changes along the timing diagram, which correspond to the internal circuitry of the chip, may be shifted relative to the input changes along the timing diagram, which correspond to the external pins coupled to the chip. For example, the timing of identifying a new memory location and simultaneously placing the circuit in a write mode may be shifted in the diagram of FIG. 2b relative to the inputs placed on the external pins of the circuit in FIG. 2a. Such a shift is emphasized in the figures by the arrows between FIGS. 2a and 2b.

FIG. 2a illustrates addresses 26 and 28 held for a small time frame subsequent to the termination of the write cycle. Such a small time frame may be referred to as the address hold time of the circuit as noted in FIG. 2a. As noted above, "address hold time," as used herein, may refer to the time for which an address of one or memory cells is held by a user of the circuit after a write operation is terminated. Such a time range may be used to insure that data from a write operation is not inadvertently written to memory cells other than the memory cells addressed or selected for such an operation. In some embodiments and as shown in FIG. 2b, the address hold time may be of sufficient time such that the addressing of a new memory location coincides with the start of a succeeding write operation within the circuit. In this manner, there may be "no intentional address delay" of the new memory location relative to the start of the succeeding write operation as shown in FIG. 2b. In yet other embodiments, the address hold time may be held for relatively longer amounts of time such that the addressing of a new memory location within the circuit is delayed relative to the start of the succeeding write operation. Alternatively, the address hold time may be held for relatively smaller amounts of time such that the addressing of a new memory location within the circuit begins before the start of the succeeding write operation. In any case, the address hold time is preferably set such that the data from the previous or succeeding write operations is not written to incorrect memory locations.

Although address hold time specifications insure the reliability of write operations of a circuit, address hold times undesirably prevent a user of a circuit from inputting an address for a succeeding operation for a finite amount of time, reducing the operating speed of the circuit. As such, in some embodiments, address hold time specifications are reduced or eliminated in order to accommodate the needs of the user. An exemplary timing diagram of a circuit with "no address hold time" is illustrated in FIG. 3a. In particular, FIG. 3a illustrates addresses 26 and 28 de-asserted by the user of the circuit upon the termination of their respective write cycles. In yet other embodiments, addresses 26 and/or 28 may be de-asserted prior to or subsequent to the termination of their respective write cycles. In any case, the reduction or elimination of the address hold time subsequent to the termination of the write cycle may be compensated by the inclusion of an intentional delay along the address paths of the circuit. Such a delay may postpone the identification of a new memory location relative to the start of a write cycle internal to the circuit. In particular, such a delay may postpone the identification of a new memory location relative to the timing of inputs along the external pins of the circuit. For example, although the external pins coupled to the circuit receive inputs to start a new write cycle and address a new memory location simultaneously in FIG. 3a, the circuitry within the chip preferably delays the addressing of the new memory location relative to the start of the write cycle in FIG. 3b. In this manner, the previous write cycle may be prevented from writing to the new memory location.

Since conventional circuits do not have address paths which include distinct logic paths for write and read operations, the inclusion of intentional delays along address paths undesirably delays the addressing of new memory locations relative to the start of read operations of the circuit as well as for write operations. For example, FIG. 3b illustrates address 30 delayed relative to a transition of a read cycle of the circuit. In general, data may not be received from a new memory location during a read operation until the internal circuitry of the circuit has identified such a memory location. As such, the inclusion of intentional delays along the address paths of a circuit may undesirably lengthen the access time of read cycles of the circuit. As a result, the operating speed of a circuit having intentional delays may be reduced relative to a circuit which does not include intentional delays along its address paths. As noted above, "access time," as used herein, may refer to the period from which an address is asserted for a read operation to a time at which data at such an address is considered valid. In particular, "access time" may refer to the period from which an input change is asserted upon an external address pin to a time at which data at such an address is considered valid. "Valid," as used herein, may refer to a state in which a specified parameter, such as data, is considered to be correct.

The differentiation between an access time for a conventional circuit having intentional delays arranged within its address paths and an access time for a conventional circuit which does not include intentional delays along its address paths may be shown by comparing FIGS. 3a and 2a, respectively. In particular, FIG. 3a illustrates access times which are substantially larger than the access times illustrated in FIG. 2a. It is noted that the read cycle times of FIGS. 2a and 3a are similar such that the access times of the circuits reflected in the respective timing diagrams may be easily compared. However, the duration of read cycle times are not necessarily dependent on whether intentional delays are incorporated within address paths of a circuit. In particular, read cycle times may be set equal to or greater than the access times of a circuit. In any embodiment, however, the access time of a conventional circuit having intentional delays arranged within its address paths is generally greater than a conventional circuit which does not include intentional delays along its address paths.

Turning to FIGS. 4a and 4b, exemplary timing diagrams of the RAM circuit described herein are illustrated. As noted above, the memory circuit described herein may be adapted to have distinct circuit paths along the address paths of the circuit for the write and read operations of the circuit. As such, the incorporation of an intentional delay along the address paths of the circuit described herein may be designated for write operations of the circuit and not for the read operations of the circuit. In yet other embodiments, the circuit described herein may include an intentional delay along both circuit paths corresponding to the write and read operations of the circuit. In such an embodiment, the intentional delay along the circuit path corresponding to the write operation of the circuit may be longer than the circuit path corresponding to the read operation of the circuit. In either case, the incorporation of an intentional delay along the circuit path corresponding to the write cycle of the circuit may allow the address hold time in the memory circuit described herein to be substantially smaller than the address hold time of conventional devices which do not include a delay along the address paths of the circuit. In some embodiments, the address hold time for the memory circuit described herein may be forgone entirely as shown in FIG. 4a. In other cases, the memory circuit described herein may allow a negative address hold time to be used.

In addition, the access time for a read operation of the circuit described herein may be shorter than the access time for a circuit which includes an intentional delay arranged along the logic paths of both the read and write operations of the circuit. In particular, the process of addressing memory locations for read operations of the memory circuit described herein is preferably delayed less than the process of addressing memory locations for read operations of circuits having intentional delays arranged along the same logic path for both the read and write operations of the circuits. Consequently, the access time of the memory circuit described herein may be shorter than the access time of circuits having dual-operation logic paths. For example, the access time depicted in FIG. 4a may be less than the access time depicted in FIG. 3a because substantially no intentional delay is incorporated within the identification of addresses 30 and 32 relative to the start of the read cycles in FIG. 4b. It is noted that the read cycle times of FIGS. 3a and 4a are similar so that the access times of the circuits reflected in the respective timing diagrams may be easily compared. However, the access time of a circuit is not necessarily dependent on the duration of the read cycle of the circuit. As such, in some embodiments, the read cycle times of FIGS. 3a and 4a may be substantially different in some embodiments.

In fact, in some embodiments, the reduction of access time in the circuit described herein relative to a conventional circuit having the same circuit path for read and write operations may allow a read cycle of the circuit described herein to be shorter than a read cycle of a conventional circuit. In particular, since data may be read from a memory cell faster in the memory circuit described herein than in a circuit which includes a dual-operation circuit path, the read cycle of the memory circuit described herein may be reduced. Consequently, the overall operating speed of the memory circuit described herein may be increased relative to conventional circuits. In any case, whether the read cycle of the memory circuit described herein is reduced relative to conventional memory circuits, the reduction of access times for the memory circuit described herein may increase the operating speed of read operations of the circuit relative to read operations of conventional circuits which do not include distinct circuit paths for read and write operations.

Figure 5:
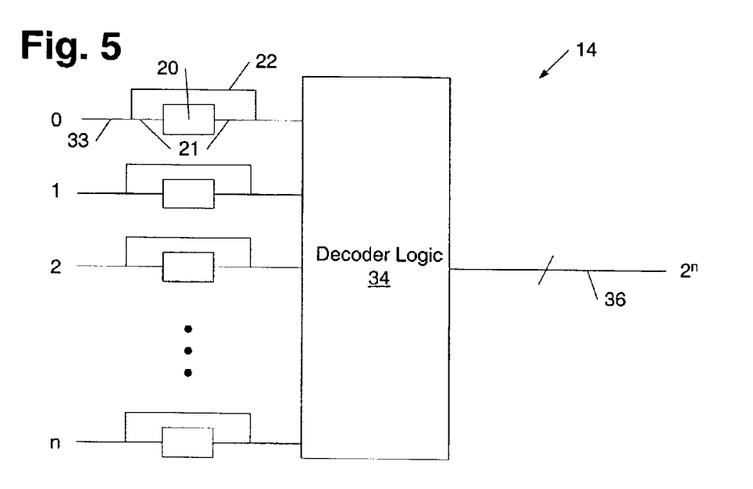
FIG. 5 depicts an exemplary block diagram of address paths included in the random access memory circuit of FIG. 1.
Figure 6:
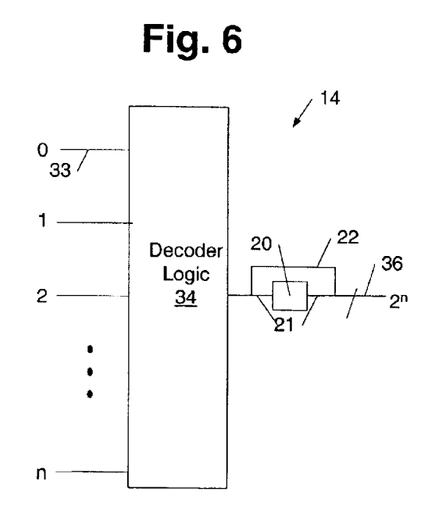
FIG. 6 depicts a different exemplary block diagram of the address paths included in the random access memory circuit of FIG. 1.
Figure 7:
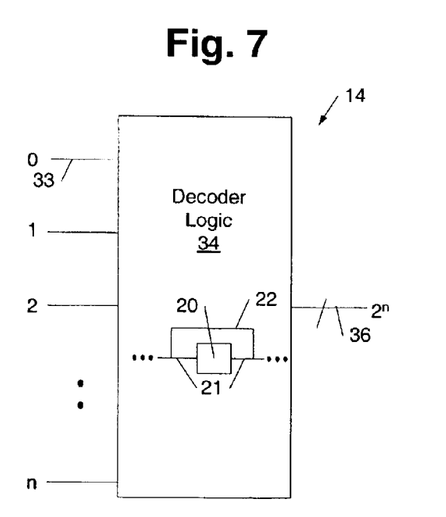
FIG. 7 depicts a different exemplary block diagram of the address paths included in the random access memory circuit of FIG. 1.

Exemplary configurations of address path 14 are shown in FIGS. 5–7 to illustrate that delay 20 may be arranged in different locations along the address path, depending on the design specifications of the circuit. More specifically, FIGS. 5–7 illustrate address path 14 as a plurality of individual address paths that may be included within RAM circuit 10. In general, an address path, as used herein may refer to the circuitry included in receiving an address input and transmitting that input to portions of the circuit to which memory cells may be identified. As shown in FIGS. 5–7, the address paths of RAM circuit 10 may include main address line 33, decoder 34, and decoded address lines 36. In general, main address lines 33 may be adapted to receive an address input entered by a user of the circuit. Decoder 34 may be adapted to direct the input from main address lines 33 to decoded address lines 36. In particular, decoder 34 may include any include any logic device known in circuit fabrication for transmitting information. For example, decoder 34 may include AND or NOR gates. In addition, decoded address lines 36 may be adapted to received data from decoder 34 and direct the data to memory array 12.

As noted above, FIGS. 5–7 illustrate different exemplary embodiments of the relative position of delay 20 along address path 14. In particular, FIG. 5 illustrates address path 14 having delay 20 arranged along main address lines 33. In contrast, FIG. 6 illustrates address path 14 having delay 20 arranged along decoded address lines 36. Although it may be preferable to arrange intentional delays along all of the decoded address lines of an address path in such an embodiment, an address path may alternatively include an arrangement of intentional delays on less than all of the decoded address lines in some cases. As such, in some embodiments, address path 14 may include delay 20 along one of decoded address lines 36. In yet other embodiments, address path 14 may include an intentional delay along main address lines 33 as well as one or more of decoded address lines 36. In addition or alternatively, delay 20 may be arranged within decoder 34 as depicted in FIG. 7. Although FIGS. 5–7 illustrate main address lines 33, decoder 34, and decoded address lines 36 having different shapes and lengths, such a differentiation between the figures does not indicate the relative size of the components with the addition of the circuitry described herein. In particular, the size and shape of the components may depend on the design specifications of the circuit.

In any case, delay 20 may be arranged along a shunt of the respective portion of address path 14. In particular, delay 20 may be arranged along portion 21 extending from portion 22 of main address lines 33 in the embodiment illustrated in FIG. 5. In the embodiment illustrated in FIG. 6, delay 20 may be arranged along portion 21 extending from portion 22 of decoded address lines 36. FIG. 7 illustrates a similar configuration of memory 20 with respect to portions of the logic paths therein. In particular, the memory circuit described herein may include an address path with a shunt adapted to bypass a portion of the address path. More specifically, at least one of main address lines 33, decoder 34, and decoded address lines 36 may include a shunt adapted to bypass a portion of the address path. In some embodiments, the memory circuit described herein may include an intentional delay on a portion of the address path bypassed by a shunt as shown in FIG. 1. In an alternative viewpoint, such a configuration may be described as a memory circuit having an intentional delay on the shunt of the address path which is adapted to bypass a portion of the address path.

In any case, delay 20 may be positioned along different portions of address path 14 than the configuration shown in FIG. 1. For example, FIG. 8 illustrates an exemplary embodiment of RAM circuit 40 including delay 20 arranged along portion 22 with portion 21 absent of an intentional delay. Consequently, FIGS. 5–7 may alternatively include delay 20 along portion 21, in some embodiments. Alternatively, address path 14 may include intentional delays 20 and 52 respectively arranged along portion 22 and portion 21 as shown in RAM circuit 50 in FIG. 9. In such an embodiment, the circuit path designated for the read operations of the circuit preferably includes a shorter delay than included on the circuit path for the write operations of the circuit.

It will be appreciated to those skilled in the art having the benefit of this disclosure that this invention is believed to provide a random access memory (RAM) circuit which is adapted to identify memory cells within a different time interval for a write operation of the circuit and than for a read operation of the circuit. Further modifications and alternative embodiments of various aspects of the invention will be apparent to those skilled in the art in view of this description. For example, the configuration of the memory circuit described herein may be used for any RAM circuit, including static RAM (SRAM), dynamic RAM (DRAM), and magnetic RAM (MRAM) circuits. It is intended that the following claims be interpreted to embrace all such modifications and changes and, accordingly, the specification and drawings are to be regarded in an illustrative rather than a restrictive sense.

What is claimed is:

1. A memory circuit adapted to identify one or more memory cells within a first time interval for a write operation of the memory circuit and identify the one or more memory cells within a second time interval for a read operation of the memory circuit, wherein the first time interval is consistently greater than the second time interval.

2. The memory circuit of claim 1, comprising an address path having a first circuit path for the write operation and a second circuit path for the read operation, wherein the first and second circuit paths are different.

3. The memory circuit of claim 2, wherein the first circuit path comprises a means for intentionally delaying the identification of the one or more memory cells for the for the write operation.

4. The memory circuit of claim 3, wherein the means for intentionally delaying the identification of the one or more memory cells for the write operation comprises a delay circuit.

5. The memory circuit of claim 3, wherein the second circuit path is absent a means for intentionally delaying the identification of the one or more memory cells for the read operation.

6. The memory circuit of claim 3, wherein the second circuit path comprises a means for intentionally delaying the identification of the one or more memory cells for the read operation.

7. A memory circuit comprising an address path adapted to identify one or more memory cells for read and write operations of the memory circuit, wherein the address path comprises a different circuit path for the read operations than for the write operations of one or more memory cells, and wherein the different circuit paths each comprise a different means for intentionally delaying the identification of the one or more memory cells.

8. The memory circuit of claim 7, wherein the circuit path adapted for identifying the one or more memory cells during the write operations of the memory circuit comprises a bypass extending from the circuit path adapted for identifying the one or more memory cells during the read operations of the memory circuit.

9. The memory circuit of claim 7, wherein the circuit path adapted for identifying the one or more memory cells during the read operations of the memory circuit comprises a bypass extending from the circuit path adapted for identifying the one or more memory cells during the write operations of the memory circuit.

10. A memory circuit comprising an address path adapted to identify memory cells for read and write operations of the memory circuit, wherein the address path comprises;

a main address line configured to receive an address input signal; and a logic decoder coupled to the main address line and configured to determine which of a plurality of decoded address lines of the address path to direct the address input signal, wherein at least one of the plurality of decoded address lines comprises a shunt adapted to bypass a portion of the address path, and further comprises a first means for intentionally delaying the identification of the memory cells for the write operations of the memory circuit.

11. The memory circuit of claim 10, wherein the first means for intentionally delaying the identification of the memory cells comprises a delay circuit.

12. The memory circuit of claim 11, wherein the delay circuit is arranged along the shunt.

13. The memory circuit of claim 11, wherein the delay circuit is arranged along the portion of the address path bypassed by the shunt.

14. The memory circuit of claim 10, wherein the delay circuit is arranged along the main address line.

15. The memory circuit of claim 10, wherein the logic decoder comprises a third means for intentionally delaying the identification of the memory cells.

16. The memory circuit of claim 12, wherein the address path is one of a plurality of address paths within the memory circuit comprising a delay circuit and a shunt.

17. The memory circuit of claim 1, wherein the memory circuit is adapted to identify the one or more memory cells for the read operation of the memory circuit subsequent to the identification of the one or more memory cells for the write operation of the memory circuit such that no other memory cells are identified between the read and write operations of the memory circuit.

18. The memory circuit of claim 7, wherein the means for intentionally delaying the identification of the one or more memory cells along the circuit path for the write operations is configured to delay the identification of the one or more memory cells for a longer time interval than the means for intentionally delaying the identification of the one or more memory cells along the circuit path for the read operations.

19. The memory circuit of claim 4, wherein the different means for intentionally delaying the identification of the one or more memory cells are each arranged along at least one of a main address line, a logic decoder and a decoded address line of the address path.

20. The memory circuit of claim 10, wherein the means for intentionally delaying the identification of the memory cells for the write operations is configured to delay the write operations for a longer time interval than a time interval used to identify memory cells for the read operations.

* * * * *

UNITED STATES PATENT AND TRADEMARK OFFICE
CERTIFICATE OF CORRECTION

PATENT NO. : 6,775,191 B1
DATED : August 10, 2004
INVENTOR(S) : Pancholy et al.

It is certified that error appears in the above-identified patent and that said Letters Patent is hereby corrected as shown below:

Title page,
Item [74], *Attorney, Agent, or Firm*, please delete "Mollie B. Lettang" and substitute therefor -- Mollie E. Lettang --.

Column 13,
Line 19, please delete "cells for the for the" and substitute therefor -- cells for the --.
Line 37, please delete "operations of one" and substitute therefor -- operations of the one --.
Line 55, please delete "comprises;" and substitute therefor -- comprises: --.

Column 14,
Line 44, please delete "claim 4" and substitute therefor -- claim 7 --.

Signed and Sealed this

Fourteenth Day of December, 2004

JON W. DUDAS
*Director of the United States Patent and Trademark Office*